United States Patent
Li et al.

(10) Patent No.: US 10,498,093 B2
(45) Date of Patent: Dec. 3, 2019

(54) CABLE CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Zhi-Yang Li, Kunshan (CN); De-Gang Zhang, Kunshan (CN); Chi-Ming Chen, New Taipei (TW); Gang Dang, Kunshan (CN); Lu-Yu Chang, New Taipei (TW)

(73) Assignees: FOXCONN (KUNSHAN) COMPUTER CONNECTOR CO., Kunshan (CN); FOXCONNINTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/231,382

(22) Filed: Dec. 21, 2018

(65) Prior Publication Data
US 2019/0199043 A1    Jun. 27, 2019

(30) Foreign Application Priority Data

Dec. 25, 2017 (CN) .......................... 2017 1 1418083
Dec. 25, 2017 (CN) .......................... 2017 1 1418618

(51) Int. Cl.
*H01R 13/71*    (2006.01)
*H01R 13/717*   (2006.01)
*H01R 13/66*    (2006.01)
*F21V 23/04*    (2006.01)
*H01B 11/00*    (2006.01)
*H05K 9/00*     (2006.01)
*F21Y 115/10*   (2016.01)

(52) U.S. Cl.
CPC ..... *H01R 13/7175* (2013.01); *F21V 23/0485* (2013.01); *H01B 11/002* (2013.01); *H01R 13/6683* (2013.01); *H05K 9/0088* (2013.01); *H05K 9/0098* (2013.01); *F21Y 2115/10* (2016.08)

(58) Field of Classification Search
CPC .................. H01R 13/7175; H01R 13/6683
See application file for complete search history.

(56) References Cited

U.S. PATENT DOCUMENTS

| 7,429,188 | B2 * | 9/2008 | Wu ..................... H01R 13/7172 439/490 |
| 7,976,336 | B2 * | 7/2011 | Yang ..................... H01R 13/717 439/490 |
| 8,378,631 | B2 * | 2/2013 | Ron ....................... H05B 37/02 320/114 |

(Continued)

*Primary Examiner* — Ross N Gushi
(74) *Attorney, Agent, or Firm* — Wei Te Chung; Ming Chieh Chang

(57) ABSTRACT

A cable connector includes a first plug, a second plug opposite the first plug, a cable connected with the first plug and second plug, and a LED light located in the first plug or the second plug, wherein the cable is provided with a braid layer located at the outermost side of the cable, the braid layer is composed of metal enameled wire mixed fibers, and the cable causes the LED light to be illuminated by capacitive sensing through proximity.

20 Claims, 3 Drawing Sheets

(56) References Cited

U.S. PATENT DOCUMENTS

| | | | |
|---|---|---|---|
| 8,475,203 B2* | 7/2013 | Wu | H01R 13/6658 |
| | | | 439/490 |
| 8,740,640 B2* | 6/2014 | Hardy | H01R 13/7175 |
| | | | 439/490 |
| 8,827,513 B2* | 9/2014 | Chen | H01R 13/6683 |
| | | | 362/382 |
| 9,028,122 B2* | 5/2015 | Tuchrelo | H01R 13/7175 |
| | | | 362/253 |
| 9,225,127 B2* | 12/2015 | Rose | H01R 13/6683 |
| 9,450,350 B2* | 9/2016 | Chen | H01R 13/717 |
| 9,461,417 B2* | 10/2016 | Zhang | H01R 13/7175 |
| 9,559,537 B2 | 1/2017 | Zander | |
| 9,660,396 B2* | 5/2017 | Chen | H01R 13/6675 |
| 9,748,706 B2* | 8/2017 | Lv | H01R 13/6658 |
| 9,859,667 B2* | 1/2018 | Zhang | H01R 13/7175 |
| 2008/0003867 A1* | 1/2008 | Wu | H01R 13/6658 |
| | | | 439/490 |
| 2011/0256769 A1* | 10/2011 | Wu | H01R 13/6658 |
| | | | 439/620.02 |
| 2013/0034990 A1* | 2/2013 | Warren | H01R 13/7175 |
| | | | 439/490 |
| 2013/0065444 A1 | 3/2013 | Bushnell | |
| 2013/0308304 A1* | 11/2013 | Tuchrelo | H01R 13/7175 |
| | | | 362/157 |
| 2016/0149353 A1* | 5/2016 | Chen | H01R 13/6675 |
| | | | 439/490 |
| 2017/0085041 A1* | 3/2017 | Zhang | H01R 13/7175 |
| 2019/0199043 A1* | 6/2019 | Li | H01R 13/7175 |

* cited by examiner

CABLE CONNECTOR

BACKGROUND OF THE INVENTION

1. Field of the Invention

The present invention relates generally to a cable connector assembly, and more particularly to a cable connector assembly equipped with a capacitive sensing cable.

2. Description of Related Arts

China Patent No. CN204216372U, issued on Mar. 18, 2015, discloses a touch-type lighting data wire which includes a cable, a first plug connected to the cable for docking with the electronic product to be charged, and a second plug for connecting with the power. However, the touch-type lighting data wire is illuminated only when a person physically touches the data wire.

U.S. Pat. No. 8,378,631, issued on Feb. 19, 2013, discloses a battery charger for an electronic device, including a cable, a light emitter connected to the cable, and a sensor connected to the cable and to the light emitter for activating the light emitter when the sensor detects one or more vicinity light requirements indicating a need for light in the environment of the sensor. Vicinity light requirements are generally pre-specified conditions. Three types of vicinity light requirements used in specific implementations are: Proximity, Lighting, and Motion.

An improved cable connector assembly is desired.

SUMMARY OF THE INVENTION

An object of the present invention is to provide a capacitive sensing cable connector.

To achieve the above-mentioned object, a cable connector includes a first plug, a second plug opposite the first plug, a cable connected with the first plug and second plug, and a LED light located in the first plug or the second plug, wherein the cable is provided with a braid layer located at the outermost side of the cable, the braid layer is composed of metal enameled wire mixed fibers, and the cable causes the LED light to be illuminated by capacitive sensing through proximity.

DETAILED DESCRIPTION OF THE PREFERRED EMBODIMENT

Figure 1:
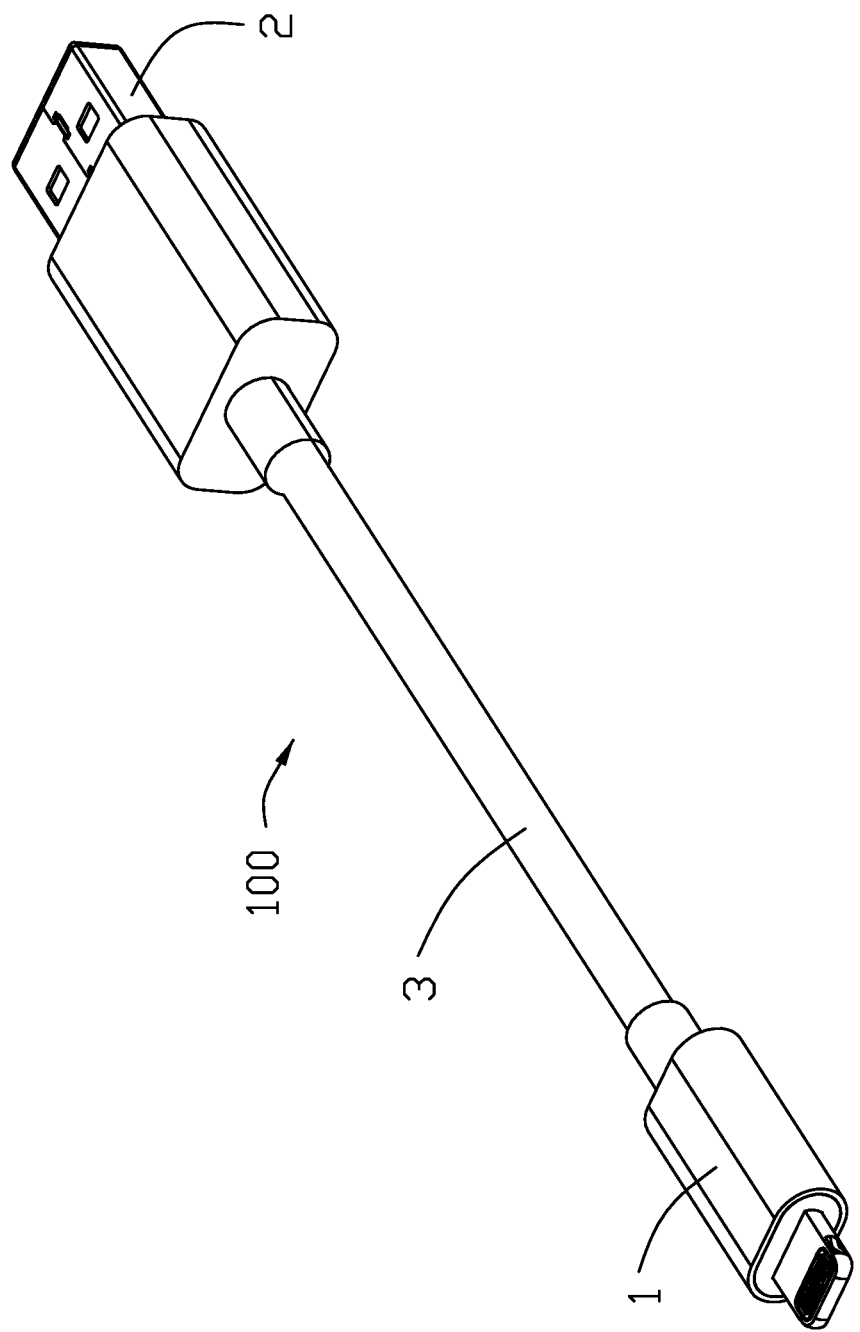
FIG. 1 is a perspective view of a cable connector in the present invention.
Figure 2:
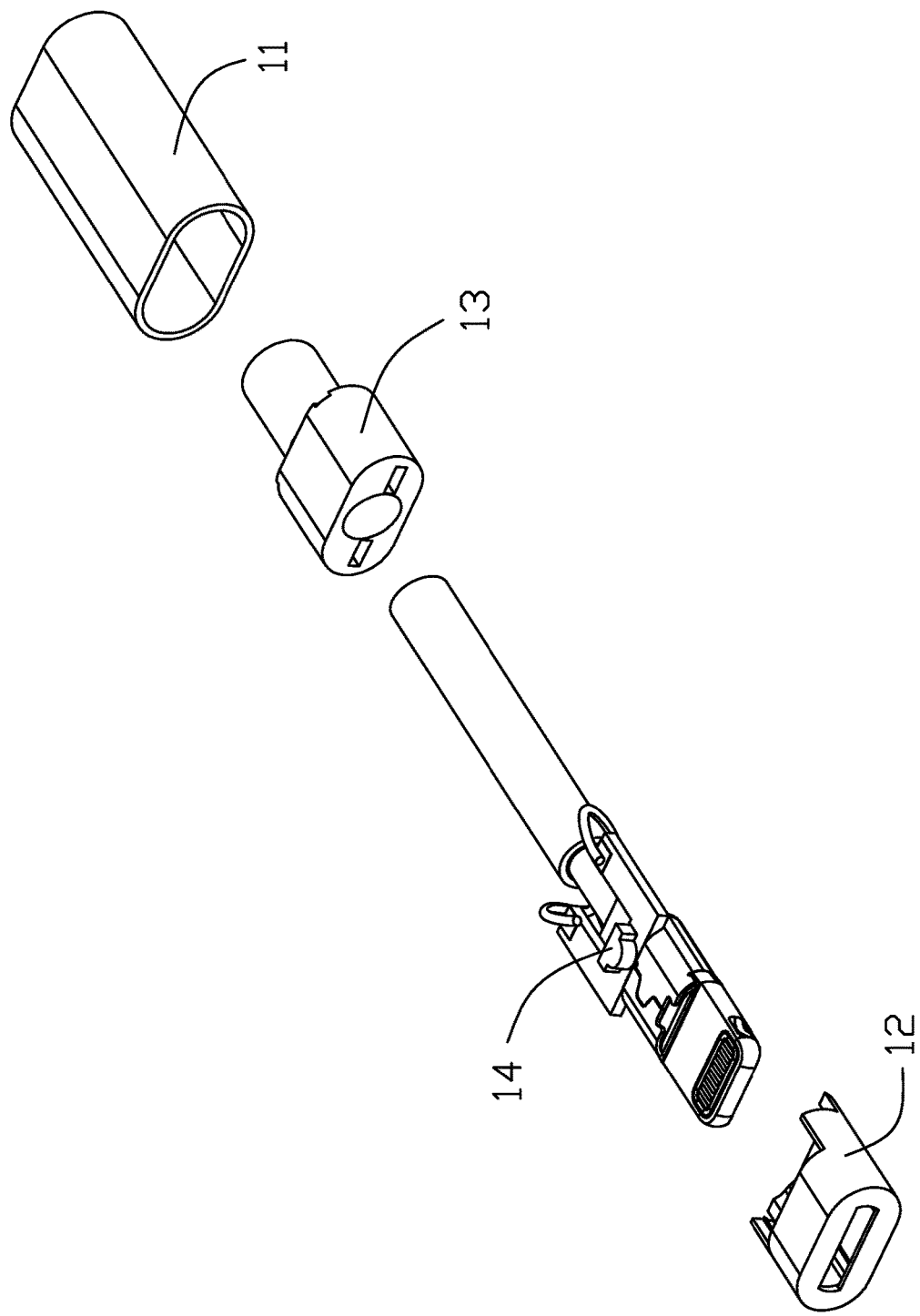
FIG. 2 is an exploded view of the cable connector as shown in FIG. 1.
Figure 3:
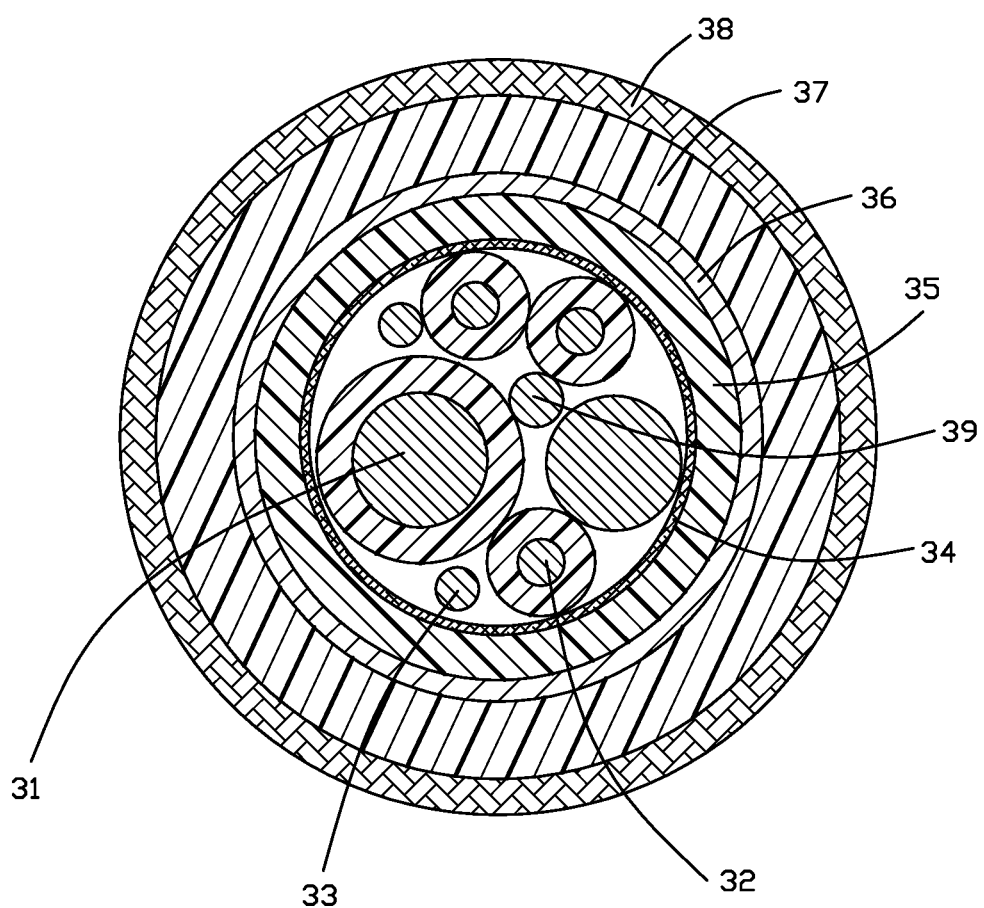
FIG. 3 is a cross-sectional view of the cable connector as shown in FIG. 1.

Referring to FIGS. 1 to 3, a cable connector in the present invention includes a first plug 1, a second plug 2 opposite to the first plug 1, and a cable 3 connecting the first plug 1 and the second plug 2.

The first plug 1 is used for docking with an electronic product to be charged and includes a shell 11, a housing 12 received in the front end of the shell 11, a cover 13 received in the rear end of the shell 11 and LED light 14 received in the shell 11.

The second plug 2 is for connecting to a power source.

The cable 3 is a USB 2.0 cable. The cable 3 includes a power wire 31, a ground wire 32, a data transmission wire 33, a shielding layer 34 covering outside of the power wire 31, the ground wire 32, and the data transmission wire 33, a first (insulative) outer layer 35 located outside the (inner) shield layer 34, a metal braid or (outer) shielding layer 36 located outside the first outer layer 35, a second (insulative) outer layer 37 located outside the metal braid layer 36 and a braid layer 38 located outside the second outer layer 37. The power wire 31 includes a positive pole and a negative pole. The positive pole includes a conductor and an inner insulating layer coated on the outer side of the conductor. The ground wire 32 is a bare conductor. The data transmission wire 33 includes a plurality of differential signal wires and an insulating layer wrapped on the outside of the differential signal wires. The data transmission wire 33 includes a plurality of differential signal wires and an insulating layer wrapped on the outside of the differential signal wires. The shielding layer 34 is an aluminum foil Mylar layer and includes an AL (Aluminum Foil) and a PET (Polyethylene terephthalate) material. The braid layer 38 is located on the outermost side of the cable 3 and is composed of metal enameled wire hybrid fibers. The cable 3 further includes a filling body 39 located inside the shielding layer 34, which makes the cable 3 more rounded and increases the breaking force of the cable 3.

The cable connector 100 further includes a printed circuit board provided with a chip. The LED light 14 is located on the printed circuit board. When the second plug 2 is connected to the power and a voltage is applied to the braid layer 38, the surface of the braid layer 38 forms a capacitance and produces a uniform electrostatic field. In the range of 15 cm from the cable 3, when the user (such as a human finger) approaches, the local electric field of the capacitance of the surface of the braid layer 38 is changed, and the two poles of the electric field of the capacitor are changed. The chip outputs a signal to the LED light 14 by reading a change in the electric field value of the capacitor, triggering the LED light 14 to emit light, so that in the case of black or dim light, the charging port of the cable connector 100 can be found more easily by simply approaching the cable 3 for accurate docking.

What is claimed is:

1. A cable connector comprising:
   a first plug;
   a second plug opposite the first plug;
   a cable connected with the first plug and second plug; and
   an LED (Light Emitting Diode) light located in the first plug or the second plug, wherein
   the cable is provided with a braid layer located at an outermost side of the cable, the braid layer is composed of metal enameled wire mixed fibers, and the cable causes the LED light to be illuminated by capacitive sensing through proximity.

2. The cable connector as claimed in claim 1, wherein the cable includes a power wire, a ground wire, a data transmission wire, and a shielding layer covering outside of the power wire, the ground wire, and the data transmission wire.

3. The cable connector as claimed in claim 1, wherein the data transmission wire includes a pair of differential signal wires and an insulating layer wrapped on the outside of the differential signal wires.

4. The cable connector as claimed in claim 1, wherein the ground wire is a bare conductor.

5. The cable connector as claimed in claim 1, wherein the shielding layer is an aluminum foil Mylar layer.

6. The cable connector as claimed in claim 1, wherein the cable includes a first outer layer located outside the shielding layer.

7. The cable connector as claimed in claim 6, wherein the cable includes a metal braid layer on the outside of the first outer layer.

8. The cable connector as claimed in claim 7, wherein the cable includes a second outer layer on the outside of the metal braid layer.

9. The cable connector as claimed in claim 8, wherein the braid layer is located outside the second outer layer.

10. The cable connector as claimed in claim 1, wherein the cable further includes a filler body on the inner side of the shielding layer.

11. A cable connector assembly comprising:
    a plug connector;
    a cable mechanically and electrically connected to the plug connector; and
    an LED (Light Emitting Diode) light located around the plug connector: wherein
    the cable is provided with a braid layer located at an outermost side of the cable, and the braid layer has a plurality of enameled copper wires intermixed therewith, and the cable causes the LED light to be illuminated by capacitive changing through proximal body touch upon the braid layer.

12. The cable connector assembly as claimed in claim 11, wherein the cable further includes a power, a ground and a data transmission wire in a center, and commonly sequentially coaxially surrounded by a first metallic shielding layer, a first insulative layer, a second metallic shielding layer, a second insulative layer and said braid layer.

13. The cable connector assembly as claimed in claim 12, wherein the second shielding layer is thicker than the first shielding layer, and the second insulative layer is thicker than the first insulative layer.

14. The cable connector assembly as claimed in claim 13, wherein said second shielding layer is made of braiding.

15. The cable connector assembly as claimed in claim 13, wherein the braid layer is thickener than the second shielding layer, and the second shielding layer is thicker than the first shielding layer.

16. The cable connector assembly as claimed in claim 15, wherein the second insulative layer is thicker than the first insulative layer.

17. The cable connector assembly as claimed in claim 16, wherein both the first insulative layer and the second insulative layer are thicker than all said braid layer, the second shielding layer and the first shielding layer.

18. A cable for mechanical and electrical connection with a plug connector which has an internal printed circuit board with an LED and a capacitive sensor thereon to expose an LED light upon the plug connector, comprising:
    a braid layer located at an outermost side of the cable, wherein
    the braid layer has a plurality of enameled copper wires intermixed therewith, whereby said cable causes the LED light to be illuminated by capacitance change through proximal body touch upon the braid layer.

19. The cable as claimed in claim 18, wherein the cable further includes a power, a ground and a data transmission wire in a center, and commonly sequentially coaxially surrounded by at least a first metallic shielding layer and a first insulative layer.

20. The cable as claimed in claim 19, wherein said cable further includes sequentially coaxially a second metallic shielding layer and a second insulative layer between the first insulative layer and the braid layer.

* * * * *